(12) United States Patent
Greenside et al.

(10) Patent No.: US 6,580,616 B2
(45) Date of Patent: Jun. 17, 2003

(54) MULTIPLE CIRCUIT BOARD ADAPTER

(75) Inventors: Michael J. Greenside, Granite Bay, CA (US); Jay R. Forkas, Rocklin, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/982,198

(22) Filed: Oct. 16, 2001

(65) Prior Publication Data

US 2003/0072138 A1 Apr. 17, 2003

(51) Int. Cl.[7] .............................. H05K 5/00; H05K 5/04; H05K 5/06
(52) U.S. Cl. ...................... 361/752; 361/753; 361/756; 361/759; 361/796; 361/801; 361/802
(58) Field of Search ................................ 361/752, 759, 361/753, 756, 796, 797, 798, 799, 736, 801, 802

(56) References Cited

U.S. PATENT DOCUMENTS

| | | | |
|---|---|---|---|
| 3,733,523 A | 5/1973 | Reynolds et al. | |
| 5,055,061 A | 10/1991 | Lichtenwalter | |
| 5,398,164 A | * 3/1995 | Goodman et al. | 361/752 |
| 5,400,222 A | 3/1995 | Nelsen et al. | |
| 5,403,208 A | 4/1995 | Felcman et al. | |
| 5,715,146 A | 2/1998 | Hoppal | |
| 5,963,681 A | 10/1999 | Clements | |
| 6,008,995 A | 12/1999 | Pusateri et al. | |
| 6,122,176 A | 9/2000 | Clements | |
| 6,169,662 B1 | 1/2001 | Clark et al. | |
| 6,269,416 B1 | 7/2001 | Meier et al. | |

FOREIGN PATENT DOCUMENTS

| | | |
|---|---|---|
| DE | 4210466 C1 | 6/1993 |
| JP | 2000156577 | 6/2000 |

OTHER PUBLICATIONS

APW, Ltd., Product Brochure, KM6–II Standard/Universal Subrack, pp. 65–67, 69–73, 89–90, published prior to Oct. 16, 2001.

(List continued on next page.)

*Primary Examiner*—David Martin
*Assistant Examiner*—Thanh Y. Tran (57) ABSTRACT

A card cage having a series of circuit board slots may be modified using various components of a circuit board adapter. The card cage has a series of slots, each slot having common dimensions and including card guides adapted to house a full height circuit board card by holding a top end and a bottom end of the full height circuit board card. Each modified slot also includes a set of cooperating vertical support member guides located within the slot which cooperate to house the vertical support member within the slot by holding the top end and the bottom end thereof. The vertical support member supports an intermediate card guide which cooperates with at least one of the card guides to house a smaller circuit board within the slot by holding a top end and a bottom end therebetween. Thus, when the intermediate card guide is removed from the slot, a full vertical height circuit board card may be inserted within the slot. When the intermediate card guides are located within the slot, one or more smaller vertical height circuit card guides may be housed within the slot. As an example, a 6U compact PCI circuit board slot can be converted to house two 3U sized compact PCI circuit board cards. This is accomplished without impinging upon the dimensions of any of the adjacent slots. The circuit board adapter may be provided as an adapter kit for use in modifying a circuit board slot. In addition, a circuit board slot may be provided with a set of standard circuit board card guides and a set of vertical support member guides to allow its selective use with alternately sized circuit board cards. A method is also provided for adapting a circuit board slot to accommodate one or more smaller vertical height circuit boards utilizing the various components of the adapter.

20 Claims, 5 Drawing Sheets

OTHER PUBLICATIONS

APW, Ltd., Product Brochure, KM6–II Subrack Piece Parts, published prior to Sep. 12, 2001.

APW, Ltd., Product Brochure, KM6–II Divider Kits, p. 169, published prior to Sep. 12, 2001.

Rittal Corp., Conversion/Divider Product Information Sheet, published prior to Sep. 12, 2001.

Rittal Corp., Ripac VME64 & VME64 Ext. —34 & 64 Information Sheet, published prior to Sep. 12, 2001.

* cited by examiner

MULTIPLE CIRCUIT BOARD ADAPTER

BACKGROUND

1. Field of the Invention

This invention relates to electrical equipment in which printed circuit cards are held in a card cage assembly, and more particularly, to providing card guides to enable the use of variously sized peripheral component interconnect cards within the card cage assembly.

2. Discussion of the Related Art

Electrical apparatuses often include components which are provided on a plug-in circuit card and attached to the apparatus by inserting the card into a connector on a mother board or backplane within the apparatus. For example, many computer designs have processor boards, memory boards, and the like which are connected to the computer by insertion into a connector on a mother board or backplane.

The most common method of interfacing circuit cards in a computer system is to provide each circuit card with a bus connector and to plug each circuit card's bus connector into a matching connector socket mounted to a backplane or mother board. When multiple circuit cards are connected to a single backplane in this manner, the resulting arrangement is often referred to as a card cage.

These circuit cards come in a variety of standard shapes and sizes. Some computer card standards such as the VME (Versa Modular Eurocard) bus standard specify that all circuit cards must have a fixed size and shape. The compact PCI (Compact Peripheral Component Interconnect) board standard uses the same Eurocard-style of VME bus applications. However, several sized boards are included within this standard. Most common are boards of either 3U (100 mm) or 6U (233.35 mm) high, with a depth of 160 mm. The 3U board accommodates full 64-bit PCI. The 6U board defines up to three additional expansion connectors. Additional buses, such as G-64, VME, or H.110 computer telephony, can be implemented as can proprietary and other user-defined functions. The board-to-board spacing is 20.32 mm (0.8 inch). Also, other sized non compact PCI boards are available, e.g., 4U, 7U, and 9U. Due to the different board sizes available, there is a need to provide a rack system or card cage for circuit cards which can accommodate variously sized and shaped circuit cards.

Previous solutions for allowing the use of smaller cards in larger sized card cage rack assemblies have involved building partitions in the card case rack assembly. The first style of partition which has been utilized is a cantilevered bar assembly that can be attached to either end of a traditional large sized card cage to split a number of larger slots into smaller slots. For example, 6U slots into 3U slots. One disadvantage of this cantilevered bar approach is that no more than two or three modified slots can be allowed. Another disadvantage is that the use of larger sized boards is eliminated in the modified slots unless a difficult bar disassembly is performed.

Another solution which has been utilized is referred to as a bridge solution. With the bridge solution, a partition is inserted into one existing full-length slot. A bridge is then formed between this partition and an outer wall or another partition. Again, one disadvantage is that the entire area between the partitions are then available for only the smaller style boards and these slots become unavailable for larger sized circuit board unless the bridge assembly is disassembled and removed in order to change the use of the slots.

Another disadvantage of the bridge solution is that the partition(s) themselves occupy a slot which would otherwise be available for circuit boards; thereby reducing the overall number of slots available for circuit cards.

SUMMARY

In one aspect of the present invention, a circuit board adapter for use with a card cage having a series of circuit board slots is provided. Each slot has common dimensions and includes card guides therein adapted to house a full height circuit board card by holding a top end and a bottom end of the full height circuit board. The circuit board adapter houses a circuit board which is of a smaller vertical height dimension than the full height circuit board within the card cage slot. The adapter includes a vertical support member having a top end and a bottom end. The adapter also includes a set of cooperating vertical support member guides located within the dimensions of the slot which cooperate to house the vertical support member within the slot by holding the top end and the bottom end of the vertical support member. The adapter further includes an intermediate card guide supported by the vertical support member which cooperates with at least one of the card guides to house the smaller circuit board within the slot by holding a top end and a bottom end therebetween.

In another aspect of the present invention, a circuit board adapter kit for use in modifying a circuit board slot is provided. The slot has standard dimensions to house a full height circuit board card. The circuit board adapter kit selectively allows the full height circuit board card or a circuit board card which is of a smaller vertical height dimension to be held within the slot. The adapter kit includes a top and a bottom replacement guide member, each replacement guide member having standard card guides and vertical support member guides, and further being sized and adapted for attachment within the slot without occupying any space within any adjacent slot. The adapter kit also includes a vertical support member supporting an intermediate card guide. The vertical support member is adapted to be held within the dimensions of the slot by cooperation with the vertical support member guides. The vertical support member is also adapted to enable selective location of the intermediate card guide within the slot and to enable the selective removal of the intermediate card guide from the slot. The top and bottom replacement guide members are adapted, once attached within the slot, to enable cooperation of the standard card guides to hold a full vertical height circuit board card within the slot when said intermediate card guide is selectively removed from the slot. The intermediate card guide of the vertical support is adapted to cooperate with at least one of the standard card guides to hold the smaller circuit board within the slot when the intermediate card guide is selectively located within the slot.

In another aspect of the invention, a circuit board slot adapted for selectively housing either a full vertical height circuit board or at least one smaller vertical height circuit board is provided. The slot includes a set of standard circuit board card guides located within the dimensions of the slot which are adapted to hold a full height circuit board, the circuit board slot also includes a set of vertical support member guides located within the dimensions of the slot which are adapted to hold a vertical support member having at least one intermediate card guide such that the at least one intermediate card guide is located to be in cooperative relationship with one of the set of standard circuit board card guides to enable the smaller circuit board to be held therebetween when said vertical support member is held by the set of vertical support member guides.

In another aspect of the present invention, a method of adapting a circuit board slot to accommodate one or more smaller vertical height circuit boards is provided. The method includes the step of locating a set of standard circuit board card guides within the dimensions of the slot which are capable of holding a full height circuit board. The method also includes the step of locating a set of vertical support member guides within the dimensions of the slot which are capable of holding a vertical support member. The method further includes the step of locating the vertical support member within the dimensions of the slot and holding the vertical support member in place via the vertical support member guides. The method additionally includes the step of supporting, within the dimensions of the slot, at least one intermediate card guide on the vertical support member in cooperative relationship with one of the set of standard circuit board card guides to enable said smaller circuit board to be held thereby.

DETAILED DESCRIPTION OF PREFERRED EMBODIMENTS

Figure 1:
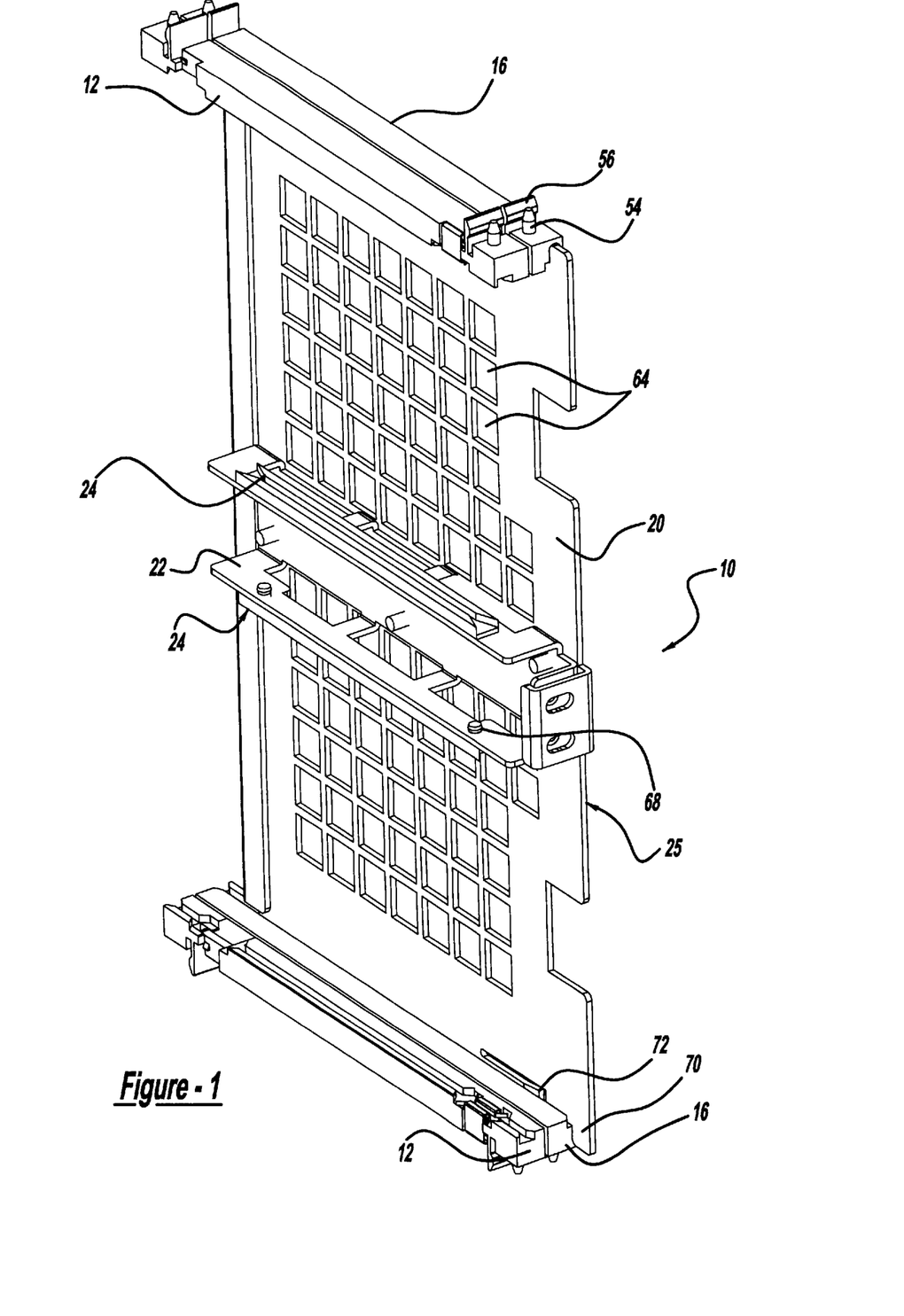
FIG. 1 is a perspective view of a preferred adapter assembly of the present invention.

Referring to FIG. 1, in one preferred embodiment of the present invention a multiple circuit board adapter assembly indicated generally as 10, is provided which converts a single 6U high slot into two 3U high slots. A 6U high card is 233 mm and a 3U high card is 100 mm. Generally, this two board adapter assembly 10 includes a set of identical upper and lower circuit board card guides 12 and a set of identical upper and lower vertical support guides 16 which hold a vertical support member 20 in place within a slot. Supported by the vertical support member 20 via a card guide support 22 are identical upper and lower intermediate circuit card guides 24 which cooperate with upper and lower circuit card guides 12 as discussed hereinafter.

Figure 2:
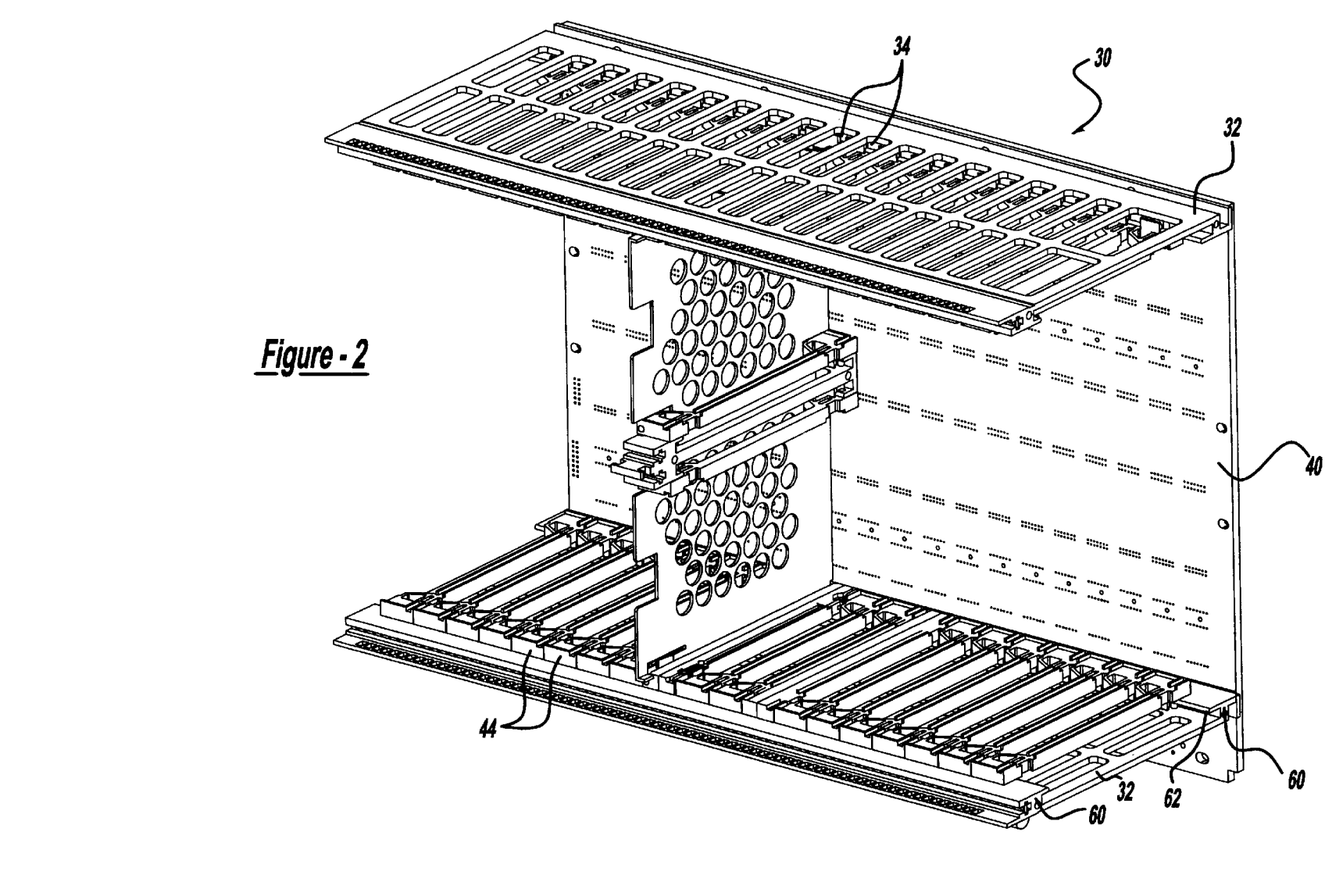
FIG. 2 is a perspective view of a card cage assembly (without side panels and which has been rotated upside down to better show components of the adapter assembly) having a series of circuit board card slots wherein some of the slots include various components of the preferred adapter assembly of FIG. 1.

Referring to FIG. 2, the present embodiment may be used, e.g., with any typical card cage assembly, including the one illustrated therein and generally indicated as 30. The illustrated card cage 30 generally includes identical top and bottom walls 32 and side walls attached thereto (not shown). The back wall 40 may include a backplane or mother board into which the connectors of circuit board cards plug when inserted into the slots of the card cage 30. For compact PCI cards, the connection between boards and backplane is through up to five 2 mm connectors defined by IEC 61076-4-101. Physically, the connectors are of a HM (hard metric) multi-pin variety.

The outer walls of the card cage may each be formed from various components. In the illustrated embodiment, two extruded metal panels are provided to form the top and bottom walls 32 of the card cage 30. These extruded panels include various openings 34 stamped or cut therein. The left and right side walls (not shown) are simply flat panels attached to the ends of the extruded metal panels of the top and the bottom walls 32 via screws.

Alternatively, one or more of the outer walls of the card cage 30 may include extruded metal bars or metal strips assembled together to form a rectangular framework and/or panel components may be assembled together to form the outer walls of the card cage 30.

Card cages 30 typically include a series of slots having standard identical upper and lower card guides 44 located in series on the top and bottom walls 32 of the card cage 30 one after another. The upper and lower card guides 44 cooperate as a set to allow a full length, 6U, circuit card 46 to be inserted into the corresponding connector socket of the backplane 40 and to hold the card 46 in place. Thus, a series of slots are created in the card cage 30 to house circuit board cards 46, each having a standard sized horizontal width dimension and vertical height dimension.

Many of the slots in the illustrated card guide merely utilize the standard card guides 44. However, it can be seen that two slots have been modified to include card guides 12 and vertical support guides 16 of the adapter of FIG. 1. In addition, one of these slots utilizes the vertical support guides 16 to hold the top and bottom ends of the vertical adapter assembly 25, which includes vertical support member 20, intermediate card guide support 22 and intermediate card guides 24. Thus, all of the components of the preferred embodiment of the adapter 10 of FIG. 1 are shown located within one slot of a typical card cage 30. The other one of the slots within the card cage 30 which has been modified to have the vertical support guides 16 inserted therein leaves the vertical adapter assembly 25 selectively absent from the slot. As can be seen with both of these modified slots, all of the components of the two board adapter 10 are located within the dimensions of slot. This means, the components of the adapter 10 do not extend into the space of any adjacent slots in a way that interferes with the location of a circuit board card in any adjacent slot. Preferably, this means that no component of the adapter 10 extends into any adjacent slot in any way.

To accomplish this in the preferred embodiment of the adapter 10 of the present invention, upper and lower cooperating vertical support guides 16 are created by cutting a standard circuit card guide 44 in half longitudinally. The half of each plastic card guide 44 which lacks the raised rails 48 is discarded. It is then rotated 180 degrees and located against another circuit card guide 44 (which has also been constructed by cutting a standard circuit card guide in half longitudinally). Thus, the pair of vertical support guide 16 and the card guide 12 occupy the horizontal width of a standard sized card guide 44 in the slot of the card cage 30. Alternatively, each upper and/or lower card guide 12 may be integrally formed as a single unit along with its corresponding vertical support member guide 16. Similar to the card guides 12, the upper and lower cooperating vertical support guides 16 operate as a set to align and hold the upper and lower ends of the vertical adapter assembly 25 within the slot.

As illustrated, each of the circuit card guides 12, 24, 44 and the vertical support member guides 16 include a pair of raised longitudinal rails 48 which cooperate to form a longitudinal channel which holds an end of a full length circuit card 46 therein, the vertical support member 20, or a smaller height circuit board card 52. These guides 12, 16, 24 or 44 may be constructed of a few protrusions on either side of a card which cooperate to guide and hold the card in place or of a recessed channel. Any alternative mechanical device for holding the ends of the circuit cards or the vertical support member 20 may be utilized. For example, all parts may be assembled or molded together and hinged to permit insertion and removal. Additionally, the vertical support member 20 may include snap fit protrusions located on the ends which cooperate with detents to make up the vertical support guide 16.

However, it is highly preferred that these guides 12, 16, 24, 44 maintain the circuit board card 46, 52 or the vertical support member 20 substantially in the plane of its final location upon insertion into the slot. Such highly preferred guides virtually eliminate the possibility that a circuit board card 46, 52 or the metal vertical support assembly 25 will come into contact with surrounding components upon insertion and removal and cause a short circuit.

Referring to FIGS. 1 and 2, both the card guides 12, 44 and the vertical support guides 16 include at least one alignment protrusion 54 and a cantilevered locking tab 56 which are utilized to locate and snap fit the guides 12, 16, 44 into place within the card cage 30. To cooperate with these components, the extruded panels forming the upper and lower walls 32 of the card cage 30 include front and back extensions 58. The extensions include a series of apertures (not shown) which cooperate with the protrusions 54 on the card guides 12, 44 and the vertical support guides 16 to locate and maintain the card guides 12, 44 and vertical support guides 16 in the desired particular horizontal position within the card cage 30 slot. In addition, the extensions include a lip 62 which cooperates with the cantilevered locking tab 56 on the guides 12, 16, 44 to retain the guides 12, 16, 44 in place utilizing a snap-fit function. Thus, the guides 12, 16, 44 are attached to the top and bottom walls 32 of the outer card cage 30 by being snap-fit into place.

Although two modified slots have been illustrated in FIG. 2, it is a simple matter to snap out the standard circuit card guides 44 and replace them with modified circuit card guides 12 and vertical support guides 16 snapped into their place. Thus, any number of slots within the card cage 30 can be adapted to accept the vertical support assembly 25. Furthermore, although snap-fit attachment is preferred to permit easy substitution between standard card guides 44 and card guide 12 with vertical support guides 16 in any slot. Any conventional attachment means could be utilized.

Figure 3:
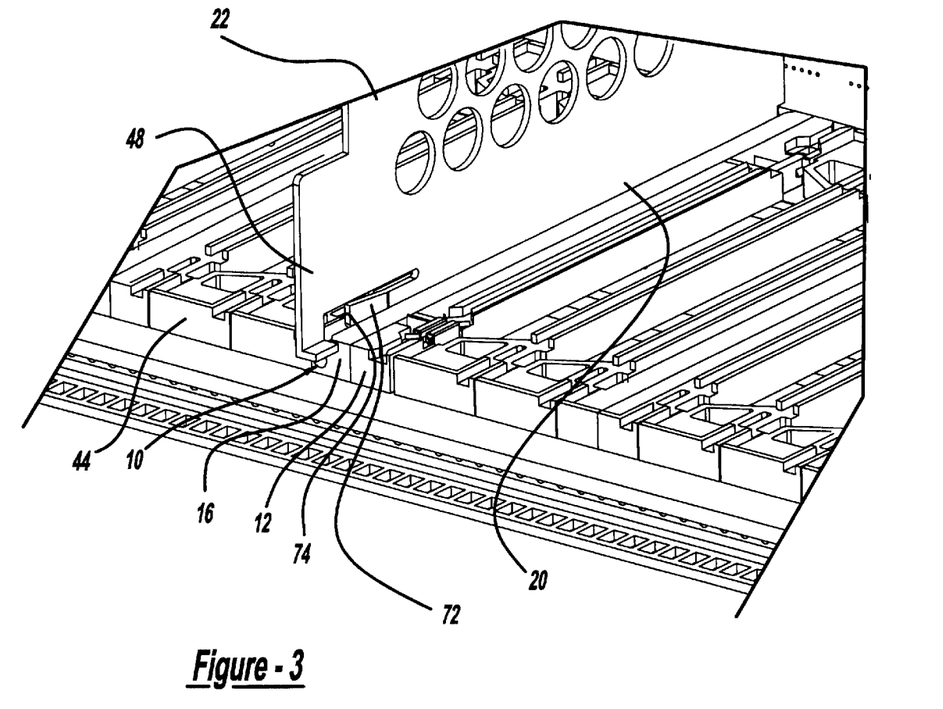
FIG. 3 is an enlarged fragmentary view of the preferred adapter assembly of FIG. 1 located within a slot of the card cage of FIG. 2.

Referring to FIG. 3, the vertical adapter assembly 25 includes a vertical support member 20 which supports intermediate card guides 24 via intermediate support member 22. The illustrated vertical support member 20 is a substantially planar metal component which includes a series of apertures 64 therein. The apertures provide, e.g., for air flow around the components of the smaller sized circuit cards 52 once they are inserted into the adapter assembly 10.

The illustrated intermediate card guides 24 which are supported by the vertical support member 20 include a plastic component which has a similar raised rail 48 construction as previously discussed. This plastic component 24 is attached to the metal intermediate card guide support 22 which is in turn attached to the vertical support member 20. The plastic components 24 are attached to the intermediate card guide support 22 by plastic protrusions 68 which may be snap fit or riveted by ultrasonic welding into place through apertures (not shown) in the intermediate card guide support 22. Any suitable attachment means could be utilized including creating the card guides 24 and intermediate card guide support 22 as a single, integral component with each other and/or with the vertical support member 20.

In the illustrated embodiment the card guide support 22 is attached to the vertical support member 20 by metal rivets. As indicated above, these components 20, 22 and/or 24 could alternatively be formed as a single integral component. As another alternative, the card guide support 22 may be releasably attached to the vertical support member 20, e.g., via wing nuts or a snap-fit arrangement. This may permit the removal of the intermediate card guides 24 to allow a full vertical height circuit board card to be used in the slot without removal of the vertical support member 20.

In still another possible alternative which involves relocation of the card guides 24 on the vertical support member 20, various attachment positions may be provided between the intermediate guide support 22 and the vertical support member 20 to allow movement of the card guides 24 to alternative selective positions on the vertical support member 20 corresponding to that necessary to hold different sized boards 52 within the slot. Various attachment means may be utilized to provide this selective location of the intermediate card guide 24. For example, various snap-fit structures may be utilized which correspond to attachment locations for various size boards, or the rivets could be replaced by wing nuts located within the intermediate card guide support 22 which cooperate with screws through various apertures in the vertical support member 20. The wing nuts and screws might also be utilized with slots in either the intermediate card guide support 22 or the vertical support member 20 to permit relocation of the intermediate card guides 24 as desired.

Figure 5:
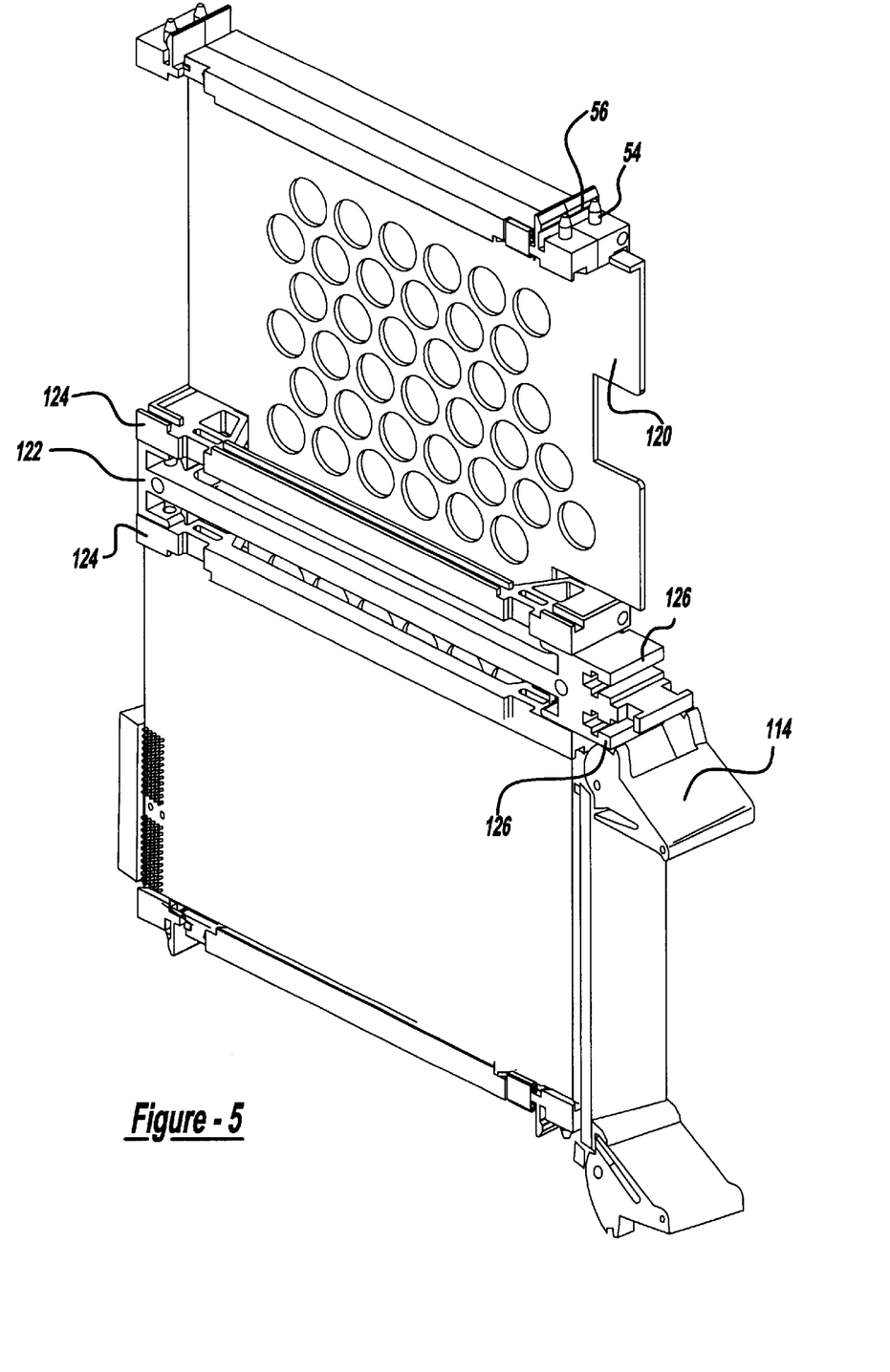
FIG. 5 is a perspective view similar to FIG. 4 of an alternative preferred adapter assembly of the present invention holding one smaller vertical height circuit board with a CPCI or VME standard insertion/extraction pivot handle.

Referring to FIG. 5, an alternative embodiment of the previously described card guide support 22 is illustrated. In this embodiment, the card guide support 122 includes intermediate card guides 124 of identical construction to the card guides 12 discussed above. These intermediate card guides 124 are attached to an extruded metal support structure 122 which is supported by the vertical support member 120. The extruded metal support 122 includes two end wall surfaces 126 against which standard rocker card inserter/extractors 114 may push to enable removal of the 3U circuit board cards 52. Thus, standard rocker card inserter/extractors 114 may be used or pull handles may be used.

Returning to FIG. 3, the vertical support member 20 also includes a tab stop 70 which provides a stop when inserting the vertical adapter assembly 25 into the vertical support guides 16. The vertical support member 20 further includes a biased locking tab 72 which, upon complete insertion into the vertical support guides 16 locks into a detent 74 formed by a break in the raised rail 48 of the vertical support guides 16. Thus, the vertical support member 20 is held firmly in place by the card guide rails 48 and retained from sliding into and out of the slot by the stop tab 70 and the locking tab 12, respectively. To remove the vertical adapter assembly 25, the locking tab 72 is simply depressed to allow it to pass by the detent 74 formed by the break in the card guide rail 48 and then the vertical support member 20 is simply slid out of the vertical support guides 16.

This allows for the vertical adapter assembly 25 to be quickly, easily, and without requiring the use of tools, selectively inserted or removed or otherwise left absent from the slot. When selectively located within the slot, the half width card guides 12 cooperate with the intermediate card guides 24 to align and hold the upper and lower ends of two 3U circuit cards 52. When the vertical adapter assembly 25 is selectively removed from the slot, a single 6U size board 48 can be held by the card guides 12 via the upper and lower ends of the 6U card. Thus, the slot can easily be modified to selectively accommodate a single 6U size board 48 or two 3U size boards 52.

Figure 4:
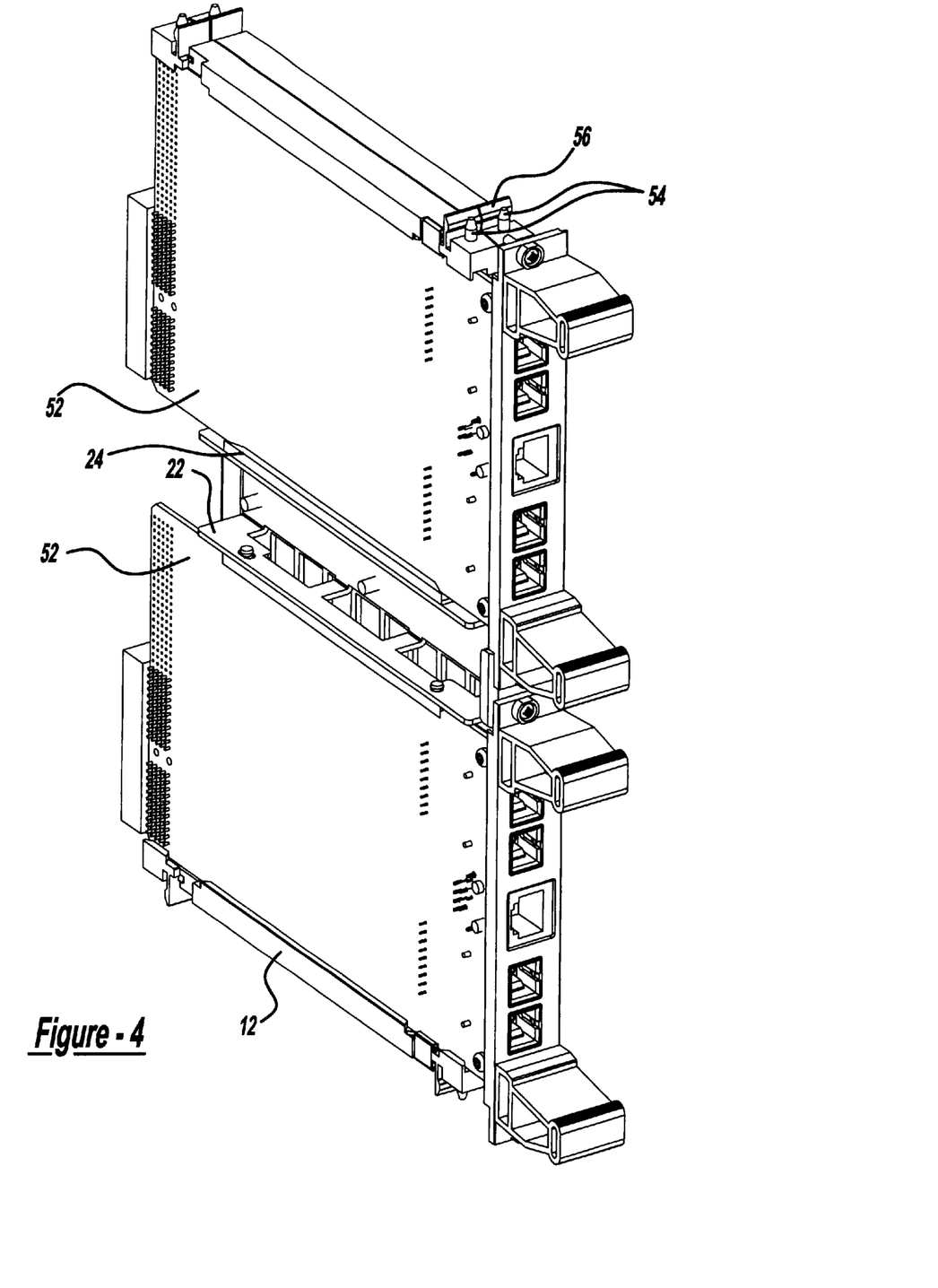
FIG. 4 is a perspective view, similar to FIG. 1 wherein the preferred adapter assembly of FIG. 1 is illustrated holding two smaller vertical height circuit board cards.

Referring to FIG. 4, although utilizing two 3U high boards 52 within one 6U high slot is illustrated, any possible combination of smaller sized circuit boards may be utilized. For example, three 3U boards may be put into a 9U slot, or one 3U and one 6U board may be located into a 9U slot. Also, non-standard sized boards may be utilized. For example, a 4U board may be placed into a 6U slot or a 7U board my be placed into a 9U slot, each with a certain amount of space simply left vacant. As yet another example, a 4U and a 3U board may be located into a 9U slot.

Of course, various other modifications to the illustrated vertical adapter assembly 25 may be made, e.g., to the basic structure of the vertical support member 20. For example, the flat planar metal component 20 may be constructed of various linear metal or plastic bars which are assembled together. In another embodiment, the vertical support member 20 might jog slightly to the left to recapture as much of the slot width as possible and maximize the horizontal clearance between the circuit board and the vertical support member 20, thereby maximizing circuit board component height.

Although channels are highly preferred as the guides 12, 16, 24, 44, any mechanism that permits relatively easy insertion of the vertical support member 20 may be utilized.

The preferred adapter 10 of the present invention, e.g., as described above with reference to FIGS. 1–4, may be provided as an adapter kit for use in modifying a circuit board slot within a card cage 30. The slot has standard dimensions to house a full height circuit board 46. The adapter kit selectively allows the full height circuit board 46 or a circuit board card 52 which is of a smaller vertical height dimension to be held within the slot. The adapter kit includes the top and bottom replacement guides 12 which are used to replace the standard card guides 44 in the slot. The standard card guides 44 are simply snapped out of the slot and the replacement card guides 12, 16 are snap-fit into the slot in their place.

The adapter kit also includes the vertical support adapter 25 as described above. Thus, a full height circuit board card 46 may be utilized in the slot housing the replacement guide members 12, 16. Alternatively, upon selectively inserting the vertical support adapter 25 into the vertical support guides 16 of the modified slot, two smaller vertical height circuit cards may be located in the slot. The adapter kit may include any of the features described above.

A card cage 30 may also be provided which includes one or more slots which have been adapted for selectively housing either a full vertical height circuit board card 46 or, e.g., two smaller vertical height circuit board cards 52 as described above with reference to FIGS. 1–4. The slot includes a set of upper and lower full height circuit board card guides 46 and a set of vertical support member card guides 52. Thus, as previously described, the slot may selectively house a full height circuit board card 46, or, e.g., two smaller vertical height circuit cards 52. The circuit board slot, so modified, may additionally include any of the features described above.

As is apparent from the above discussion, particularly with reference to FIGS. 1–4, a method of adapting a circuit board slot to accommodate one or more smaller vertical height circuit boards 52 is also provided. The method includes locating a set of full height circuit board card guides 12 within the slot. Locating within the slot a set of vertical support member guides 16 is also done. The method also includes the step of locating within the slot and holding in place via the vertical support member guides 16 the vertical support member 20. The method additionally includes the step of supporting at least one intermediate card guide 24 on the vertical support member 20 in cooperating relationship with one of the set of standard support guides 12 to enable one or more smaller vertical height circuit boards 52 to be held within the slot. The method may additionally include providing and/or utilizing any of the features described above.

Although particular embodiments of the present inventions have been shown and described, modifications may be made without departing from the teachings of the present invention. Nothing contained in the detailed description should be interpreted to imply a limitation not expressly stated therein. For example, the use or lack of use of descriptions of specific alternative embodiments or of the phrases "the illustrated" or "as illustrated" do not imply the lack of possible optional constructions within the spirit and scope of the present inventions. Accordingly, the present invention comprise all embodiments within the scope of the appended claims.

What is claimed is:

1. A circuit board adapter for use with a card cage having a series of circuit board slots, each slot having common dimensions and including card guides therein adapted to house a full height circuit board card by holding a top end and a bottom end of the full height circuit board, the circuit board adapter allows for housing a circuit board which is of a smaller vertical height dimension than the full height circuit board within the card cage slot, the adapter comprising:

a vertical support member having a top end and a bottom end;

a set of cooperating vertical support member guides located within the dimensions of the slot which cooperate to house the vertical support member within the slot by holding the top end and the bottom end of the vertical support member; and an intermediate card guide supported by said vertical support member which cooperates with at least one of the card guides to house the smaller circuit board within the slot by holding a top end and a bottom end therebetween.

2. A circuit board adapter according to claim 1, wherein each replacement guide member includes two separate components; one of the components having the card guide and the other component having the vertical support guides.

3. A circuit board adapter according to claim 1, wherein the vertical support member further includes a detent locking mechanism.

4. The circuit board adapter according to claim 1 wherein the vertical support member is substantially planar.

5. A circuit board adapter according to claim 1, wherein the vertical support member supports said intermediate card guide by an attachment mechanism which allows for adjustment to accommodate different sized smaller vertical height circuit boards.

6. A circuit board adapter according to claim 1, wherein the card guides are adapted to house a 6U full height circuit board card and the intermediate card guide is two intermediate card guides which cooperate with two of the standard card guides to house two 3U smaller circuit boards within the slot.

7. A circuit board adapter kit for use in modifying a circuit board slot, the slot having standard dimensions to house a full height circuit board card, the circuit board adapter kit selectively allows the full height circuit board card or a circuit board card which is of a smaller vertical height dimension to be held within the slot, the adapter kit comprising:

- a top and a bottom replacement guide member, each replacement guide member having standard card guides and vertical support member guides, each replacement card guide member further being sized and adapted for attachment within the slot without occupying any space within any adjacent slot;
- a vertical support member supporting an intermediate card guide, the vertical support member being adapted to be held within the dimensions of the slot by cooperation with the vertical support member guides and to enable selective location of the intermediate card guide, within the slot, and to enable the selective removal of the intermediate card guide from the slot;
- the top and bottom replacement guide members being adapted, once attached within the slot, to enable cooperation of the standard card guides to hold a full vertical height circuit board card within the slot when said intermediate card guide is selectively removed from the slot; and
- the intermediate card guide of the vertical support being adapted to cooperate with at least one of the standard card guides to hold the smaller circuit board within said slot when the intermediate card guide is selectively located within the slot.

8. A circuit board adapter kit according to claim 7, wherein each replacement guide member includes two separate components; one of the components having the card guide and the other component having the vertical support guides.

9. A circuit board adapter kit according to claim 7, wherein the vertical support member further includes a detent locking mechanism.

10. The circuit board adapter kit according to claim 7, wherein the vertical support member is substantially planar.

11. The circuit board adapter kit according to claim 7, wherein the kit selectively allows a 6U full height circuit board card or two 3U smaller vertical height dimension circuit cards to be held within the slot.

12. Circuit board slot adapted for selectively housing either a full vertical height circuit board or at least one smaller vertical height circuit board, the slot comprising:

- a set of standard circuit board card guides located within the dimensions of the slot which are adapted to hold a full height circuit board; and
- a set of vertical support member guides located within the dimensions of the slot which are adapted to hold a vertical support member having at least one intermediate card guide such that the at least one intermediate card guide is located to be in cooperative relationship with one of the set of standard circuit board card guides to enable said smaller circuit board to be held therebetween when said vertical support member is held by the set of vertical support member guides.

13. A circuit board slot according to claim 12, wherein the set of standard circuit board card guides and the set of vertical support member guides are located on a single integral component.

14. A circuit board slot according to claim 12, further comprising a detent locking mechanism for cooperating with cooperating locking mechanism on the vertical support member for selectively locking a vertical support member in place within the slot.

15. A circuit board slot according to claim 12, wherein the full vertical height circuit board is a 6U height circuit board and the at least one smaller vertical height circuit board is two 3U height circuit boards.

16. A method of adapting a circuit board slot to accommodate one or more smaller vertical height circuit boards, the method comprising the steps of:

- locating a set of standard circuit board card guides within the dimensions of the slot which are capable of holding a full height circuit board;
- locating a set of vertical support member guides within the dimensions of the slot which are capable of holding a vertical support member;
- locating the vertical support member within the dimensions of the slot and holding the vertical support member in place via the vertical support member guides; and
- supporting, within the dimensions of the slot, at least one intermediate card guide on the vertical support member in cooperative relationship with one of the set of standard circuit board card guides to enable said smaller circuit board to be held therebetween.

17. A method for adapting a circuit board slot according to claim 16, further comprising the step of selectively removing the intermediate support guides to selectively allow for insertion of full size card within the slot.

18. A method of adapting a circuit board slot according to claim 16, wherein the step of locating the vertical support member within the vertical support member guides further includes releasably locking the vertical support member in place.

19. A method of adapting a circuit board slot according to claim 16, wherein the step of supporting at least one intermediate card guide on the vertical support member includes the step of choosing where from among at least two locations on said vertical support member to support the intermediate card guide.

20. The method of adapting a circuit board slot according to claim 16, wherein the step of supporting at least one intermediate card guide on the vertical support member includes supporting two intermediate card guides such that one 6U slot is modified to hold two 3U circuit boards.

* * * * *